United States Patent
Lee et al.

(10) Patent No.: US 6,808,605 B2
(45) Date of Patent: Oct. 26, 2004

(54) FABRICATION METHOD OF METALLIC NANOWIRES

(75) Inventors: Yun-Hi Lee, Seoul (KR); Byeong-Kwon Ju, Seoul (KR); Yoon-Taek Jang, Seoul (KR); Chang-Hoon Choi, Sungnam (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/266,352

(22) Filed: Oct. 7, 2002

(65) Prior Publication Data

US 2003/0072885 A1 Apr. 17, 2003

(30) Foreign Application Priority Data

Oct. 15, 2001 (KR) .......................................... 2001-63421

(51) Int. Cl.$^7$ ........................... C23C 14/34; C23C 8/00; B05D 1/36

(52) U.S. Cl. .................. 204/192.15; 427/585; 427/294; 427/248.1; 427/402

(58) Field of Search .................. 204/192.15; 427/248.1, 427/294, 402, 585

(56) References Cited

U.S. PATENT DOCUMENTS 6,231,744 B1 * 5/2001 Ying et al. ................... 205/324
2003/0189202 A1 * 10/2003 Li et al. ....................... 257/14

* cited by examiner

*Primary Examiner*—Steven Versteeg
(74) *Attorney, Agent, or Firm*—Darby & Darby

(57) ABSTRACT

A fabrication method of metallic nanowires includes the steps of: forming a layer of autocatalytic metal with a thickness of 30 nm–1000 nm on the surface of a substrate; and forming nanowires on the front surface of the layer of autocatalytic metal, wherein the substrate is put into an evaporator and the layer of autocatalytic metal is grown by autocatalytic reaction for 10~5000 seconds. A large amount of nanowires can be grown on a substrate without a lithography process.

9 Claims, 6 Drawing Sheets

FABRICATION METHOD OF METALLIC NANOWIRES

BACKGROUND OF THE INVENTION

1. Field of the Invention

The present invention relates to a fabrication method of metallic nanowire, and more particularly, to a fabrication method of a metallic nanowire that is capable of growing a large amount of nanowires on a substrate without a lithography process and heterogeneous catalytic metal.

2. Description of the Background Art

The metallic nanowire, usually fabricated by a highly fine etching process, are used as a probe of an atomic force microscope (AFM) or a scanning tunneling microscope (STM), or an electron emission tip of an electron emission display device.

As the semiconductor device is scaled down and integrated at a fast and continual pace compared with the trend in those past years, it is expected that the use of metallic nanowire or nano-rods in the field of nanoelectronics and nanomechanics will continue to increase. Up to now, the minimum size of a metal nanowire implemented in a silicon as a product is about 0.35 $\mu$m and it is expected that the size would be reduced to the level of about 0.1 $\mu$m. However, with a conventional lithography process, it is difficult to form the metallic nanowire of below 0.1 $\mu$m. Therefore, a novel method has been required in forming metallic nanowires on a semiconductor substrate.

Recently, the 'bottom-up' method of fabricating a high integrated semiconductor device with the nano size without being much dependent on the lithography technique have been adopted in a self-assembly growth and the growth of a nano wire or a nano-rod of a first-dimensional quantum wire.

Thus, in fabrication of the semiconductor device, it is expected that the current 'top-down' method will be replaced with a 'bottom-up' method. The former has an advantage that it can accomplish an integrated semiconductor device with an excellent regularity and reproducibility on the basis of the established technique, but it has shortcomings that it is absolutely dependent on the lithography technique development. Conversely, since the latter uses a mechanism that a material itself of a semiconductor device is formed with a nano size in fabrication of the semiconductor device, it does not have a dependence on the lithography technique. But the difficulty in reproducibility and standardization leads to the difficulty in integration of a molecular device of a high yield.

As shown in FIGS. 1 and 2, a bulk material is processed by fine etching, so that the tip of it may get sharper as it goes upward from the wide base. In such a case, since the fabricated tips have different shapes, it is difficult to standardize them.

In addition, it is not easy to uniformly etch and form the tips in a hole with 1 $\mu$m size in case of using the tips as a field emission source of the field emission display device or an amplifier.

SUMMARY OF THE INVENTION

Therefore, an object of the present invention is to provide a fabrication method of metallic nanowires that is capable of growing a large amount of metallic nanowires on a substrate by in-situ process without both a lithography process and heterogeneous catalytic metal.

To achieve these and other advantages and in accordance with the purpose of the present invention, as embodied and broadly described herein, there is provided a fabrication method of metallic nanowires including the steps of: forming a layer of autocatalytic metal with a thickness of 30 nm–1000 nm on the surface of a substrate; and forming nanowires on the front surface of the layer of autocatalytic (or self-catalytic) metal, wherein the substrate is put into an furnace (or process chamber) and the layer of autocatalytic metal is grown by autocatalytic reaction for 10~5000 seconds.

In the fabrication method of metallic nanowires according to the invention, the nanowire growth time is important and the reason is as follows.

In order for the layer of autocatalytic metal to be grown to metallic nanowires by the autocatalytic reaction, a stress more than a specific value by a thermal energy should exist in the layer of autocatalytic metal. In order to make such an effect, the growth time needs to be above 10 sec. However, if the growth time exceeds 5000 sec, the grown nanowires lumps to be transited to a conventional continuous film form.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

A fabrication method of metallic nanowires of the present invention will now be described in detail with reference to the accompanying drawings.

Embodiment

A substrate is put in an electric furnace and an oxide layer, i.e. an insulating layer, is formed with a thickness of 200~1000 nm on the surface of the substrate by a wet air oxidation and then a tungsten thin film, a layer of autocatalytic metal, is formed with a thickness of 30~1000 nm on the surface of the substrate with the oxide layer formed thereon by using an E-beam evaporator or a sputter. Subsequently, the substrate with the tungsten thin film formed thereon is put in a low pressure CVD apparatus and an individual or a bunch of nanowires is/are grown on the front surface of the tungsten thin film by, the autocatalytic reaction.

The fabrication process will now be described in more detail.

a) Prior to forming the layer of autocatalytic metal, the substrate is put in the electric furnace, and the oxide layer is formed with a thickness of 500 nm on the surface of the substrate by the wet air oxidation in a state that the electric furnace is maintained at a temperature of 1100° C. As a separate experiment the growth of nanowires were successfully achieved with very thin insulating layer of 1–5 nm.

b) In the step of forming the layer of autocatalytic metal for growing the metal nanowires on the oxide layer, a metal source made of more than 99% tungsten is installed inside the sputter, and the tungsten thin film is formed with the thickness of 30~1000 nm on the surface of the oxide layer by sputtering in a state that the internal temperature of the sputter is maintained at the temperature of 25° C.~300° C.

c) In the step of growing the metal nanowires, the substrate with the tungsten thin film formed thereon is put in the low pressure CVD apparatus, into which Ar/H$_2$ gas is injected at 30~300 sccm, and then maintained at a temperature of 500~850° C. for about 10~5000 seconds. Accordingly, as the tungsten thin film is autocatalized, the nanowires are grown on the front surface thereof.

Figure 1:
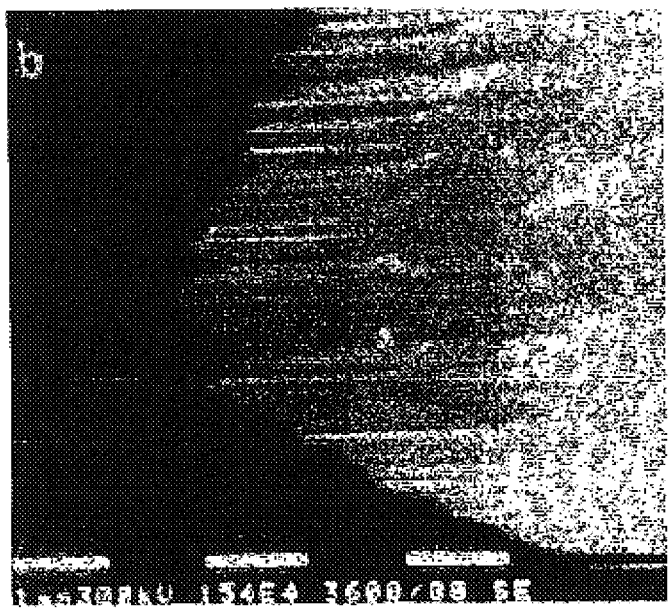
FIG. 1 is a photograph of a scanning electronic microscope (SEM) of tungsten tips fabricated by a fine etching process in accordance with a conventional art.
Figure 2:
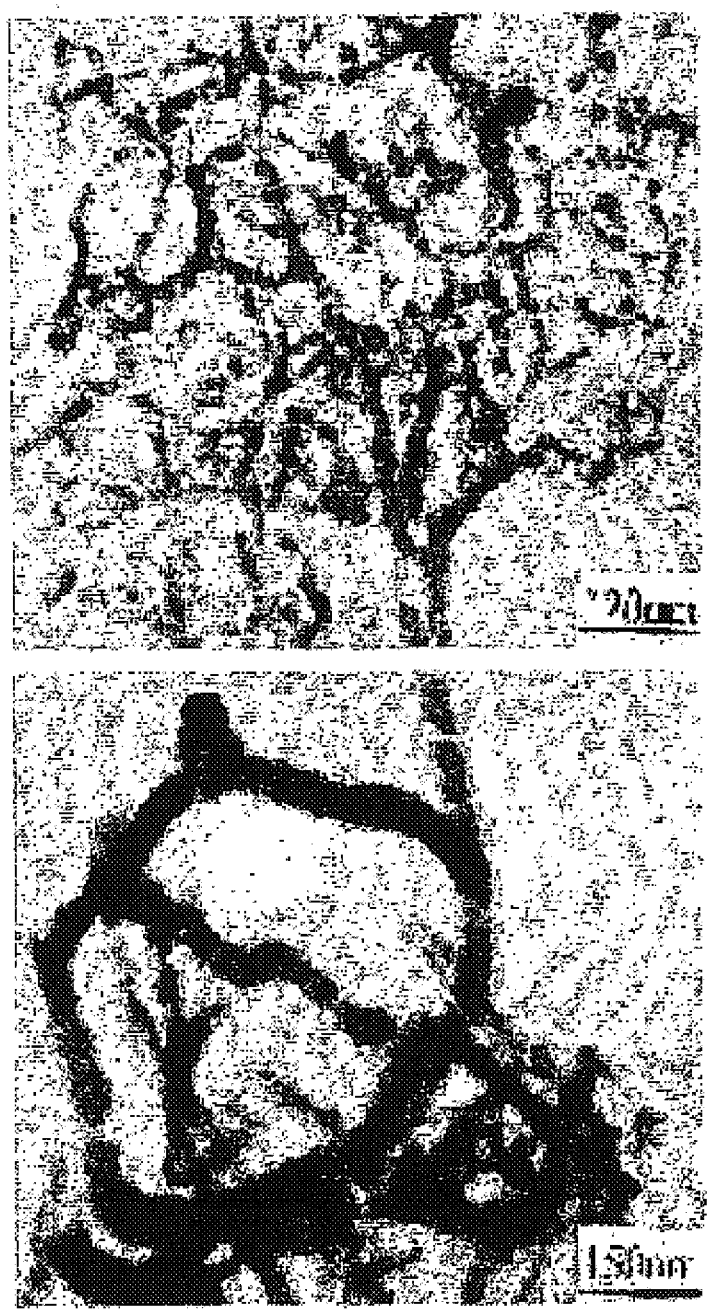
FIG. 2 is photographs of the SEM of tungsten nanowires formed on a surface of carbon nanotube by using a thin film coating process in accordance with the conventional art.
Figure 3:
FIG. 3 is photographs of the SEM of tungsten nanowires grown by in-situ process on a substrate in accordance with the present invention.
Figure 4:
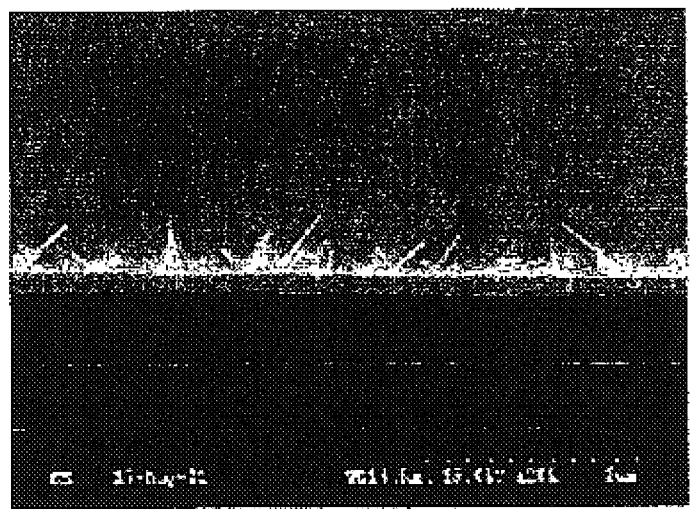
FIG. 4 is a photograph of the SEM of tungsten nanowires grown by in-situ process on a substrate in accordance with the present invention.

As shown in FIGS. 3 and 4, the tungsten nanowires as finally grown in accordance with the present invention has an excellent linearity and a high density, and is uniformly formed with a diameter of about 10~100 nm on the front surface of the substrate with a diameter of 4 inches.

Meanwhile, the planar density of the tungsten nanowires can be controlled by changing the thickness of the layer of autocatalytic metal and the nanowire growth time.

Figure 5:
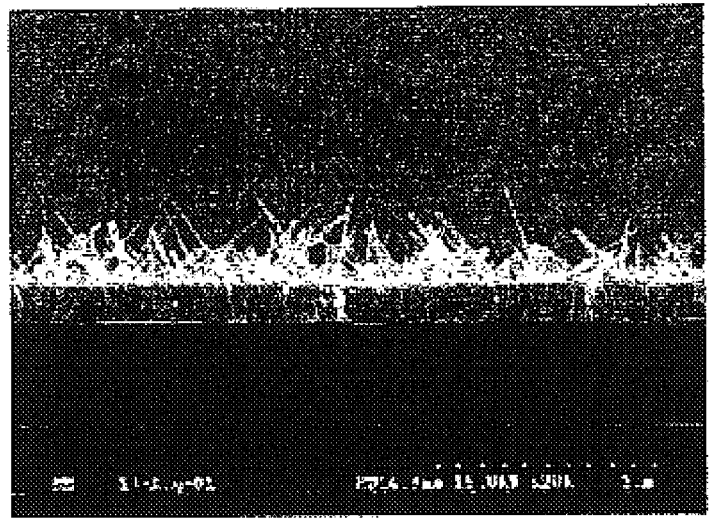
FIG. 5 is a photograph of the SEM taken after a planar density of nanowires is controlled by changing a thickness of a layer of autocatalytic in accordance with the present invention.
Figure 6:
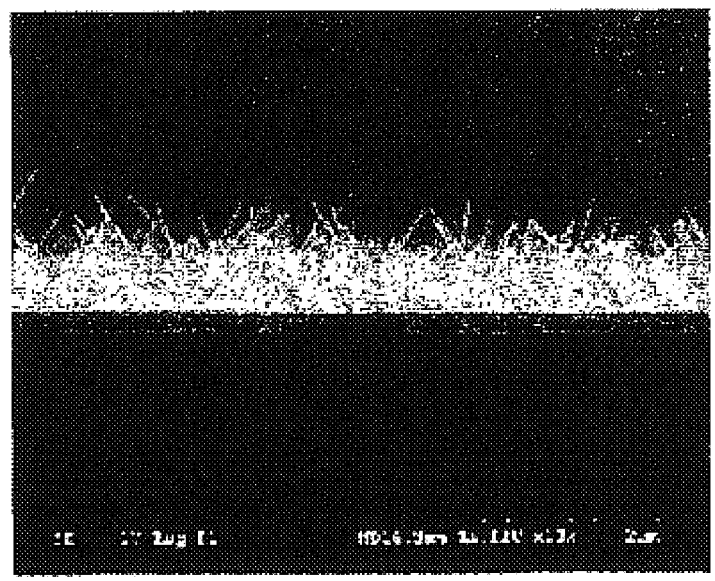
FIG. 6 is a photograph of the SEM taken after a planar density of nanowires is controlled by changing a growing time of the nanowires in accordance with the present invention.

As shown in FIGS. 5 and 6, the planar density of the tungsten nanowires differs remarkably as the thickness of the tungsten thin film and the nanowires growth time are changed.

Figure 7A:
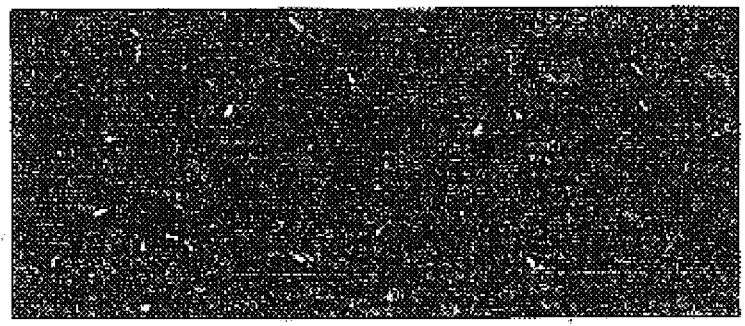
FIGS. 7A through 7C are photographs of SEM of the surface state of a substrate observed according to nanowires growth time.
Figure 7B:
Figure 7C:

Especially, as shown in FIGS. 7A–7C, if the nanowires growth time is very short (FIG. 7A, in case of less than 10 sec), nanowires were never grown. Conversely, if the nanowires growth time is too long (FIG. 7C, in case of exceeding 5000 sec), the surface state of the layer of autocatalytic metal was maintained the same as before the growth. FIG. 7B shows metallic nanowires formed uniformly on the entire surface of the substrate.

One of the remarkable feature of the fabrication method of the metallic nanowires of the present invention is that, as shown in FIGS. 4 to 6, in the process of growing the nanowires, the front area of the metallic layer deposited on the substrate serves as the autocatalysis and the metallic layer itself is grown to the nanowires.

That is, in the fabrication method of the metallic nanowires of the present invention, the metal nanowires are perfectly grown on the substrate by in-situ process without using the nanolithography technique.

The conventional art is a method that the whole or the tip of a bulk tungsten fragment or a tungsten nanowire with a thickness of a few mm is put in an etching solution and processed, or that a microtip is formed by using a semiconductor fine photoetching and the lithography process.

Comparatively, the fabrication method of the metallic nanowires of the present invention is that the nanowires with the diameter of the nano size are grown on the substrate by the in-situ process without the nanolithography process.

As so far described, the fabrication method of metallic nanowires of the present invention has the following advantages.

Since the tungsten nanowires are selectively grown on a desired position of a desired substrate by the in-situ process, and integrated, the fabrication method of metallic nanowires of the present invention can be used as, for example, a mass-production technique for a core effector such as a nano electron/spin devices, nanomachines, probes, electron emission display or a nano-biodriver which employs the metallic nanowires, and a connecting wire.

As the present invention may be embodied in several forms without departing from the spirit or, essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims. For example, the substrate can be Si, glass with high melting point, alumina and the like, which are not easily deformed in the temperature of above 700° C. Further, it should be understood that although forming the layer of insulator precedes forming the autocatalytic metal in above embodiment, the former process is not indispensable to the invention, but can be alternatively adopted in the field of nanoelectronics.

What is claimed is:

1. A fabrication method of metallic nanowires comprising the step of:

forming a layer of autocatalytic metal on the surface of substrate; and subjecting the substrate and the layer of autocatalytic metal to an autocatalytic reaction by which nanowires are formed from the layer of autocatalytic metal.

2. The method of claim 1, further comprising the step of forming an insulating layer on the surface of the substrate before forming the autocatalytic metal layer, wherein the insulating layer is an oxide layer formed by a wet air oxidation.

3. The method of claim 1, wherein the layer of autocatalytic metal is formed by sputtering 99.9% tungsten metal source in a sputter at temperature of from about 25° o about 300° C.

4. The method of claim 1, wherein the layer of autocatalytic metal is grown under the conditions of injection Ar/H$_2$ gas at 30~300 sccm into a chamber of ail evaporator, the gas pressure of 10 mtorr~100 torr, and a temperature of 500~850°C.

5. The method of claim 1 wherein said substrate and said layer of autocatalytic metal are placed in a CVD apparatus to produce the autocatalytic reaction.

6. The method of claim 1 wherein said layer of autocatalytic metal has a thickness of from about 30 nm to about 300 nm.

7. The method of claim 6 wherein said substrate and said layer of autocatalytic metal is placed in a CVD apparatus at a time of from about 10 to about 5000 seconds.

8. The method of claim 7 wherein said autocatalytic metal is tungsten to produce tungsten nanowires.

9. The method of claim 1 wherein said autocatalytic metal is tungsten produce tungsten nanowires.

* * * * *